(12) United States Patent
Koerber et al.

(10) Patent No.: US 7,130,199 B2
(45) Date of Patent: Oct. 31, 2006

(54) OPERATING ELEMENT FOR ENGAGING AND EXTRACTION OF PLANAR SUB-ASSEMBLIES

(75) Inventors: Werner Koerber, Betzenstein (DE);
Kurt Michael Schaffer, Eckental (DE);
Ralf Behrens, Nürnberg (DE)

(73) Assignee: Rittal RES Electronic Systems GmbH & Co. KG, Herborn (DE)

( * ) Notice: Subject to any disclaimer, the term of this patent is extended or adjusted under 35 U.S.C. 154(b) by 764 days.

(21) Appl. No.: 10/110,816

(22) PCT Filed: Aug. 17, 2001

(86) PCT No.: PCT/EP01/09524

§ 371 (c)(1),
(2), (4) Date: Aug. 28, 2002

(87) PCT Pub. No.: WO02/15657

PCT Pub. Date: Feb. 21, 2002

(65) Prior Publication Data

US 2003/0109157 A1    Jun. 12, 2003

(30) Foreign Application Priority Data

Aug. 17, 2000  (DE) .......................... 200 14 196 U

(51) Int. Cl.
*H05K 7/14* (2006.01)

(52) U.S. Cl. ....................... 361/754; 361/801; 439/157

(58) Field of Classification Search ............... 174/52.1, 174/52.4, 520, 561; 439/157, 160, 911; 361/740, 361/748, 754, 759, 798, 801, 802
See application file for complete search history.

(56) References Cited

U.S. PATENT DOCUMENTS

| 4,313,150 | A | * | 1/1982 | Chu | 361/801 |
|---|---|---|---|---|---|
| 4,996,631 | A | * | 2/1991 | Freehauf | 361/798 |
| 5,003,431 | A | * | 3/1991 | Imsdahl | 361/798 |
| 5,766,031 | A | * | 6/1998 | Yeh | 439/328 |
| 5,940,276 | A | * | 8/1999 | Kurrer et al. | 361/754 |
| 5,959,843 | A | * | 9/1999 | Kurrer et al. | 361/754 |
| 6,128,198 | A | * | 10/2000 | Kurrer et al. | 361/759 |
| 6,220,879 | B1 | * | 4/2001 | Ulrich | 361/798 |
| 6,475,016 | B1 | * | 11/2002 | Heidenreich et al. | 439/352 |
| 6,582,241 | B1 | * | 6/2003 | Lutz, Jr. | 439/157 |
| 6,741,479 | B1 | * | 5/2004 | Korber et al. | 361/801 |
| 6,924,430 | B1 | * | 8/2005 | Koerber et al. | 174/52.4 |

\* cited by examiner

*Primary Examiner*—Dean A. Reichard
*Assistant Examiner*—Adolfo Nino
(74) *Attorney, Agent, or Firm*—Pauley Petersen & Erickson

(57) ABSTRACT

An operating element for engaging and extraction of a planar sub-assembly with an end-piece prepared for connection to the planar sub-assembly. An operating lever rotatably mounted on the end-piece has at least one grip section and a locking element which may be displaced, in particular shifted between at least two switch positions, whereby in a first switch position, the operating lever is held in a state with the planar sub-assembly in an engaged position and in a second switch position, the operating lever is released for extraction. The operating lever has at least one combined display/switching element.

25 Claims, 3 Drawing Sheets

OPERATING ELEMENT FOR ENGAGING AND EXTRACTION OF PLANAR SUB-ASSEMBLIES

BACKGROUND OF THE INVENTION

1. Field of the Invention

This invention relates to an actuating element for levering a PC board in and out, and to a front system for a PC board, having at least one actuating element, an associated PC board, as well as a board support for receiving the PC boards with a front system in a manner for levering in and out.

2. Description of Related Art

An actuating element with an end piece for levering a PC board in and out is known from German Utility Patent Application 299 22 725.1 (Siemens), which can be connected with a PC board and has an actuating lever which is rotatably seated on the end piece.

Such known PC boards customarily have electrical indicator elements which display, for example, the operational state of an operating element of the front board and in this case are customarily separately integrated into the front plate of the front board. A separate installation space is thus required.

SUMMARY OF THE INVENTION

One object of this invention is to provide an actuating element for levering a PC board in and out, which has an indicator and operating element which is attached in a space-saving manner. It is also intended to provide an associated front system for such a PC board, a PC board with such a front system, as well as a board support for receiving such PC boards in a manner in which they can be levered in and out.

In connection with the actuating element, this object is attained with the features of the claim preamble. Advantageous embodiments of the actuating element are described in other claims and in this specification. Regarding the front system, the object is achieved by characteristics related to the PC board and the board support.

The actuating element in accordance with this invention has at least one combined electrical indicator/operating element. The indicator/operating element of this invention is attached in a structurally space-saving manner in the actuating lever as a combined element. Customarily a separate indicator element is provided, for example in the front plate of the PC board, and the operating element is integrated in the actuating element separately from the indicator element. As taught by prior art, it is necessary to separately mount the indicator and the operating element. In accordance with this invention, it is possible to attach the combined indicator/operating element to the actuating lever in an easy to assemble and structurally space-saving manner.

The indicator/operating element has an indicator sub-element, in particular an LED component, as well as an operating sub-element. The indicator sub-element and the operating sub-element can be connected with each other in various ways and can be, for example, attached to each other in a module-like manner. Thus it is possible to exchange or replace individual indicator sub-elements and operating sub-elements.

The combined indicator/operating element is advantageously partially or wholly integrated into the locking element of the actuating lever, so that there is a reduced distance from current supply contacts of the PC board.

In accordance with a further embodiment of this invention, the combined indicator/operating element is adjustably arranged in the locking element, for example it is displaceably attached to the locking element. In this way the combined indicator/operating element of this invention can be displaced together with the locking element into two operating positions A and B.

If the operating sub-element of the combined indicator/operating element has an operating lever, it is actuated, in particular while displacing the locking element, in one operating position, and is relieved in the other operating position. While levering the actuating lever out, the PC board can initially be switched into a passive state by displacing the locking element, for example in a rear operating position B. Thereafter, because of the simultaneous unlocking of the actuating lever in this operating position of the locking element, turning of the actuating lever is possible for levering out the PC board at the end.

In the actuated state, the operating lever of the operating sub-element advantageously rests against a stop, in particular a fixed one, of the actuating lever. A swivel pin of the actuating lever seated in a bore can be used as such a stop. This swivel pin is positionally stable with respect to the displaceable locking element, so that an operating sub-element of the combined indicator/operating element, which is displaced along with the locking element, is at different distances from the stationary swivel pin. Thus an operating lever on the operating sub-element can be actuated in a position of the locking element close to the swivel pin and can be relieved in a remote position.

BRIEF DESCRIPTION OF THE DRAWINGS

This invention is explained in greater detail in view of exemplary embodiments shown in the drawings, wherein.

DESCRIPTION OF PREFERRED EMBODIMENTS

Figure 1:
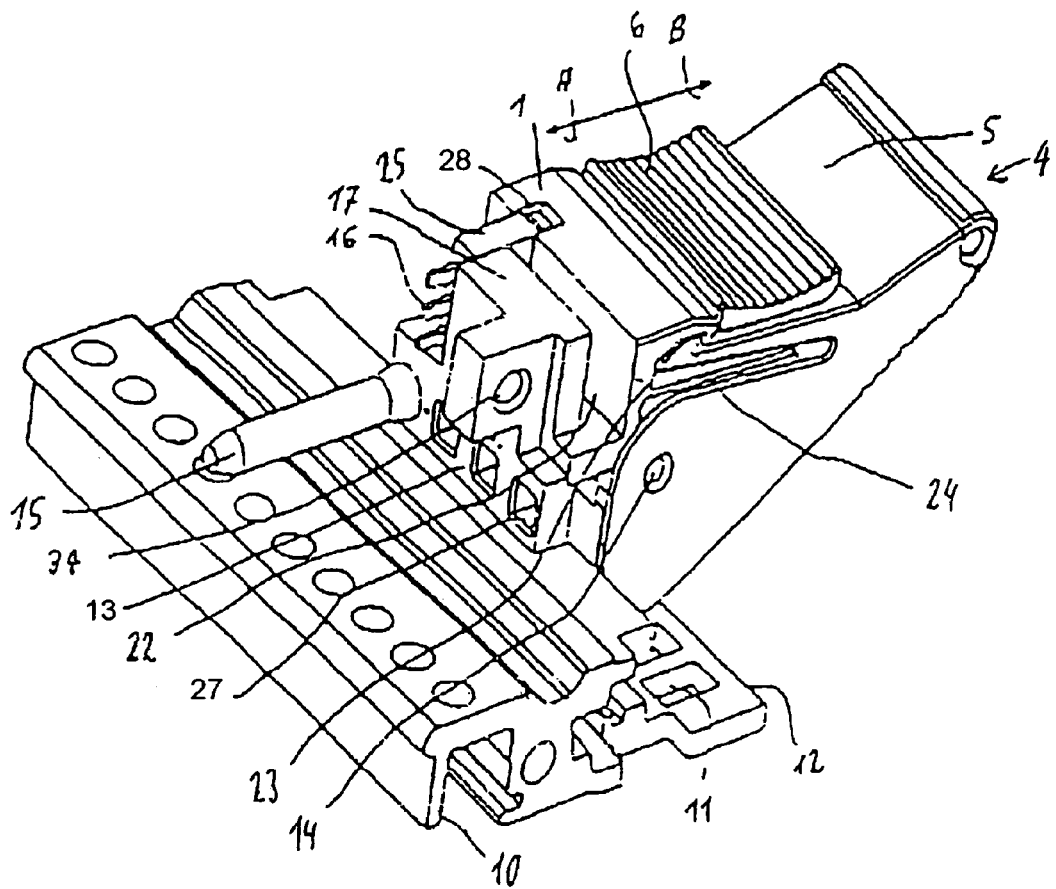
FIG. 1 is a perspective lateral view of one embodiment of an actuating element in accordance with the prior art.
Figure 2:
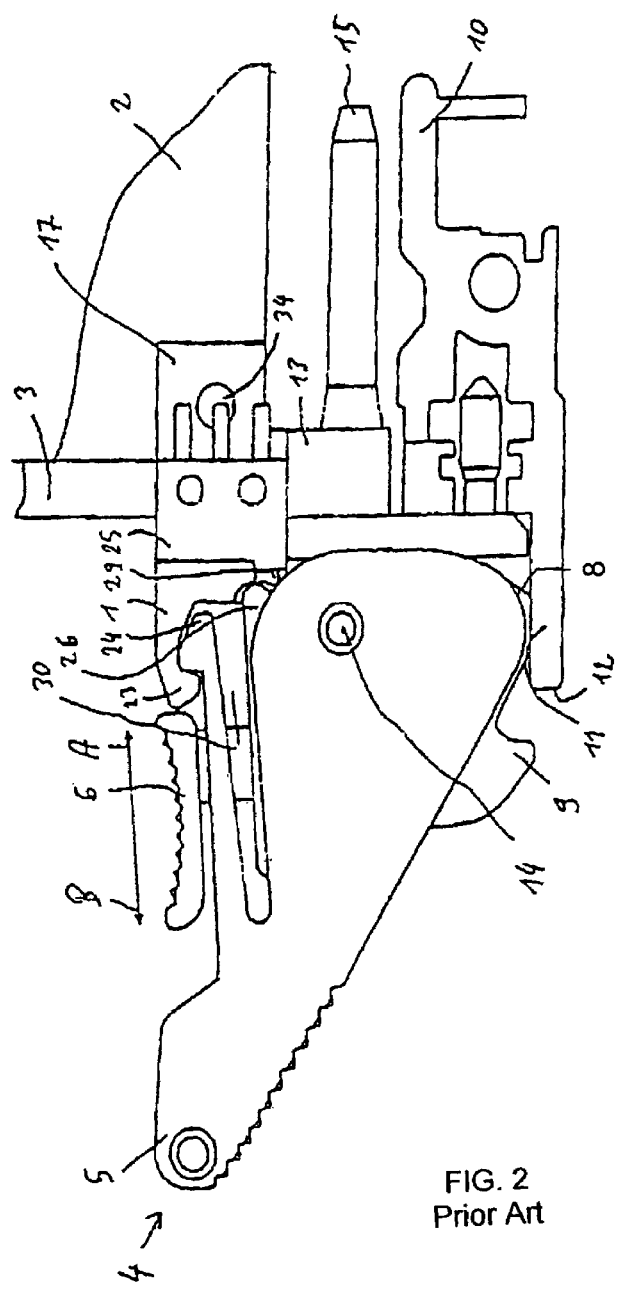
FIG. 2 is a lateral plan view on a front system for a PC board with an actuating element in accordance with the prior art shown in FIG. 1.

FIG. 1 shows an actuating element in accordance with the prior art for levering in and out a PC board 2, which has an end piece 1 for connection with a PC board 2 and a front plate 3, also shown in FIG. 2.

In this case the actuating element rests on a lower transverse rail 10 of a board support and has as its main components an actuating lever 4, an end piece 1 and a front plate 3 which, for reasons of clarity, is not shown in FIG. 1. The end piece 1 has a central supporting function because, for one example, it is used as a support for an actuating lever 4, which is rotatably seated in a bore 14. On the other hand, it can also be used for supporting the lower end of the front plate 3, which for this purpose is advantageously inserted into a groove 22.

The connection between the lower end piece 1 and the front lower corner of the PC board 2, as shown in FIG. 2, preferably occurs via a retaining block 17 by a screw engaging a bore 34.

Also, it is possible to attach still further components to such an end piece 1. Thus, the end piece 1 shown in FIG. 1 contains a coding block 13, into which coding chambers 27 for inserting coding pins, not shown, are cut. These can engage coding chambers attached on the side opposite to the lower transverse rail 10, which are equipped with complementarily coded coding pins. It is thus possible to assure that only a defined selected PC board 2 can be positioned in a plug-in position of a board support. Finally, there is also a guide pin 15 provided which, after engagement in an oppositely located guide bore, not shown in the drawings, assures a skew-free correct insertion of the PC board 2.

The actuating lever 4 is used for levering the PC board into or out of the respective plug-in position, which can be operated by actuating the handle portion 5 when placing the locking element 6 into the operating position (B).

When levering out, the actuating lever 4 must be pushed down, so that at least one levering protrusion 9, projecting at an underside, can be supported on a front edge 12 of the lower transverse rail 10. In the opposite manner, when levering in, the actuating lever 4 must be pushed up, so that a levering protrusion 8, also projecting at the underside, can be supported in the interior of at least one engagement depression 11, which is also located in the area of the front edge 12 of the lower transverse rail 10.

Customarily means are also provided on the end piece 1, through which the actuating lever 4 can be fixed in place in the appropriate position when the completely inserted state of the PC board into the board support has been reached. This inserted state is shown in FIG. 1. For this purpose, the actuating lever 4 advantageously has a detent protrusion 24 on its top, which is oriented toward the end piece 1, is resilient and extends upward, and extends behind a detent edge 23 on the end piece 1, which is oriented in the direction toward the actuating lever 4 and extends downward.

In the same way a corresponding arrangement of an upper end piece 3 with an upper actuating lever 4 rotatably attached to it is attached in the corner area of the PC board 2 represented in FIG. 2. For levering in and out, the lever then engages a corresponding transverse rail of a PC board, not shown in the drawings.

An operating element 25 is integrated into the lower or the upper end piece of the actuating element in accordance with the prior art shown in FIG. 1 and FIG. 2, which is actuated by means of the actuating lever 4 when it is in the fixed position, operating position A. Thus it is possible to electrically isolate the PC board 2 attached to the actuating lever 4, for example by activating its current supply. Inversely, it is also possible to switch the PC board 2 into an electrically passive state because, at the moment of levering out the PC board 2, the engagement of the actuating lever 4 with the operating element 25 integrated into the end piece 1 is terminated, and the electrical current supply of the PC board 2 is again placed in the passive state by release of the operating element 25.

The operating element 25 is seated in a receiving slot 28, which extends as far as the detent edge 23 of the end piece 1. Thus, an operating portion of the operating element 25, for example an operating lever 29, projects into the area below the downward pointing detent edge 23. When the fixed state of the actuating lever 4, operating position A, is reached, the operating lever 29 is actuated by the operating slide 26 of the locking element 6 of the actuating lever 4 when the actuating lever 4 is in the position A. The locking element 6 is connected with the operating slide 26 via a connecting element 30.

When the actuating lever 4 is displaced into the position B, as shown in FIG. 2, the operating lever 29 is relieved and the operating element 25 is switched into a second operating state, wherein the PC board 2 is placed in a passive state.

Then the actuating lever 4 can be levered out in that its handle portion 5 is moved downward, in the direction toward the transverse rail 10, because of which the detent protrusion 24 of the actuating lever 4 is elastically released from the detent edge 23 of the end piece 1. The operating element 25 can be activated or passivated by the displacement of the locking element 6 between the positions A and B in FIG. 2, and this independently of a complete release of the actuating element 4 by the described downward levering out of the actuating lever 4, for removing the PC board 2 from the board support.

Further details for constructing the actuating element of the prior art in accordance with FIGS. 1 and 2, and in particular the functioning of the locking element 6, are taught by the German Utility Model Application 299 22 725.1 (Siemens), the disclosure of which is explicitly incorporated into this specification.

The integrated operating element 25 can be advantageously electrically connected with the PC board 2 via a cable connection or plug-in cable connection, which can be connected to its connecting contacts 16.

Thus it is possible to actuate the operating element 25 in an always assured and wear-free manner by means of the actuating element if the operating means of the operating element 25 have a very short operating path.

Since the active-passive operating function is completely integrated into the actuating element, users of the front system have no restrictions regarding the positioning of components on a PC board equipped with a front system of this type. In particular, no dimensionally accurate position fastenings regarding electrical connections for the operating element are required.

Figure 3:
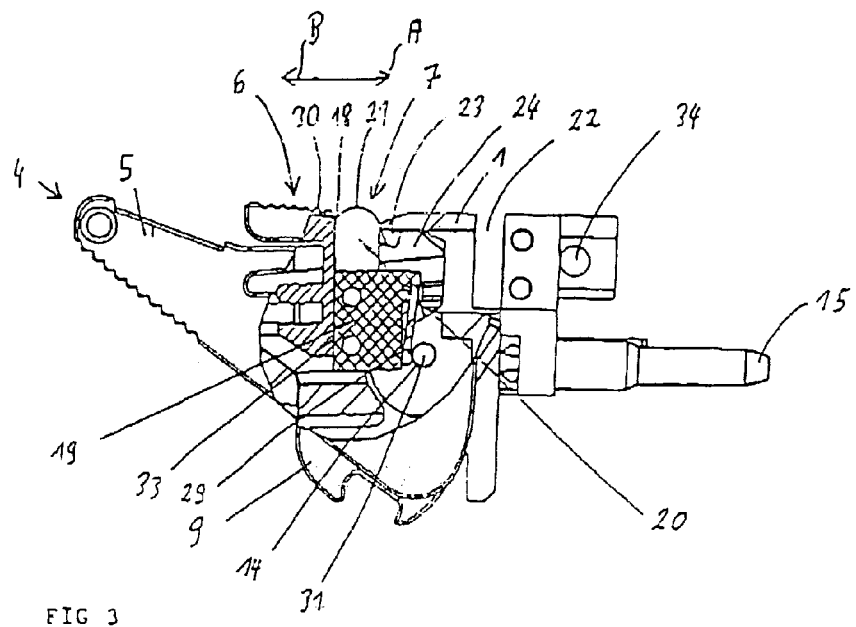
FIG. 3 is a sectional view of a schematic embodiment of an actuating element of this invention with the operating element actuated.
Figure 4:
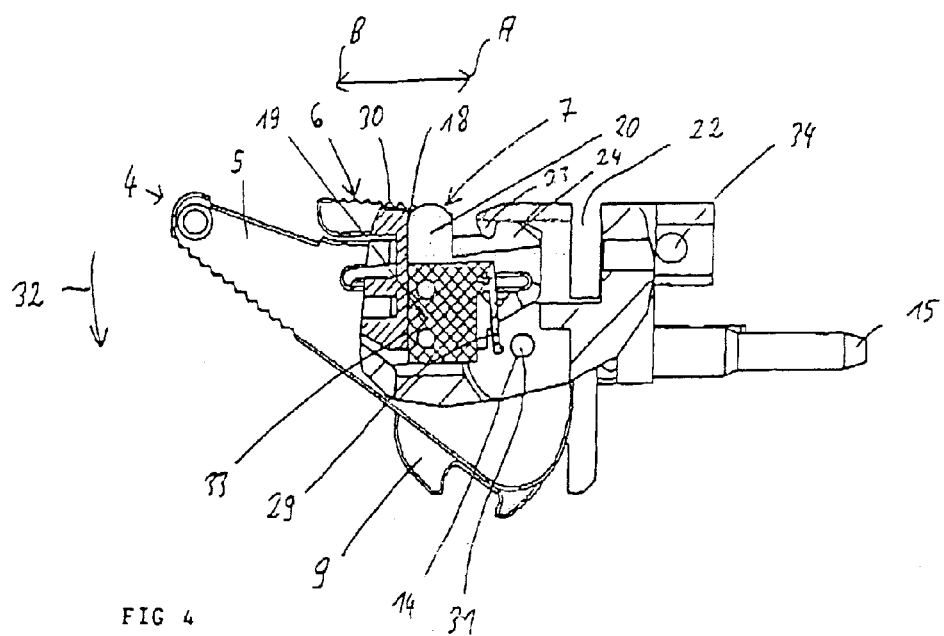
FIG. 4 is a sectional view of a schematic embodiment of an actuating element of the invention in accordance with FIG. 3, with the operating element relieved.

To the extent that the structure of the actuating element in accordance with FIGS. 3 and 4 corresponds to the structure of the actuating element in accordance with the prior art in FIGS. 1 and 2, identical reference symbols are used which, without supplemental explanations, also have the functions represented in the description of the drawings of FIG. 1 and FIG. 2.

FIG. 3 is a sectional representation of an actuating element in accordance with this invention, without the transverse rail 10, the PC board 2, the front plate 3 in accordance with FIGS. 1 and 2, having a combined indicator/operating element 7 received in the locking element 6, and with an operating sub-element 19 and an indicator sub-element 20. The indicator/operating element 7 is received in a cutout 18 of the locking element 6. Thus the indicator sub-element 20 is attached directly to the operating sub-element 19 and is advantageously electrically connected with the indicator sub-element 20 by means of contacts in the interior.

In FIG. 3, the locking element 6 is in the operating position A, so that the indicator sub-element 20 of the combined indicator/operating element 7 rests against the edge 23 of the end piece 1. Here, the edge 23 of the end piece 1 can be used as a stop for the indicator sub-element 20, and therefore for the locking element 6.

In the operating position A of the locking element 6 shown in FIG. 3, the operating lever 29 of the operating sub-element 19 is actuated and rests against the swivel pin 31 of the actuating lever 4 received in a bore 14.

If the locking element 6 is brought into the operating position B, as shown in FIG. 4, the resilient or elastic operating lever 29 of the operating sub-element 19 is relieved and no longer rests against the swivel pin 31. With this arrangement, the operating sub-element 19 has changed its operating state and has, for example, switched the PC board, not shown in FIGS. 3 and 4, passive. Thereafter the actuating element 4 can be levered out in the direction of rotation 32, because of which the detent projection 24 is pushed off downward and is released from engagement with the edge 23 of the end piece 1.

It is possible in accordance with this invention that, prior to levering out the actuating lever 4 in the direction of rotation 32, a defined and precise switch to the passive state of the PC board 2 occurs by displacement of the locking element 6 into the operating position B, and therefore by changing over the operating sub-element 19 of the combined indicator/operating element 7.

The indicator sub-element 20 and/or the operating sub-element 19 of the combined indicator/operating element 7 have movable connecting contacts, known per se, for example as contact rails, for a connection with connecting contacts stationarily arranged in the end piece 1 for the current supply with the PC board, not shown in the drawings.

The indicator sub-element 20 of the combined indicator/operating element 7 is in particular embodied as an LED component and can be used for indicating operational states of the operating lever 29 of the operating sub-element 19.

Essentially, the surface 21 of the indicator sub-element 20 ends flush with the surface 30 of the locking element 6. Thus the combined indicator/operating element 7 is received in a recessed manner in the locking element 6.

For fastening the combined indicator/operating element 7, the operating sub-element 19 can be connected with a contact area 33 of the locking element 6. During a displacement of the locking element 6 from the operating position A to B and back, it is possible to transmit the movement of the locking element 6 to the combined indicator/operating element 7 via the contact area 33.

German Patent Reference 200 14 196.1, the priority document corresponding to this invention, and its teachings are incorporated, by reference, into this specification.

The invention claimed is:

1. An actuating element for levering a PC board (2) in and out, comprising:
   an end piece (1) connectible with the PC board (2),
   an actuating lever (4) rotatably seated on the end piece (1) and comprising a handle portion (5) and a locking element (6) which is displaceable between at least two operating positions (A, B) and which in a first operating position (A) of the two operating positions (A, B) maintains the actuating lever (4) in a first position which corresponds to a levered-in state of the PC board (2), and which releases the actuating lever (4) in a second operating position (B) of the two operating positions (A, B), and
   the actuating lever (4) having at least one combined indicator/operating element (7) comprising an operating sub-element (19) and an indicator sub-element (20), wherein the indicator sub-element (20) is mounted on the indicator/operating element (7) and is electrically connected with the operating sub-element (19).

2. The actuating element in accordance with claim 1, wherein the at least one combined indicator/operating element (7) is attached to the locking element (6).

3. The actuating element in accordance with claim 2, wherein the at least one combined indicator/operating element (7) is partially integrated into the locking element (6).

4. The actuating element in accordance with claim 2, wherein the at least one combined indicator/operating element (7) is integrated into the locking element (6).

5. The actuating element in accordance with claim 4, wherein the at least one combined indicator/operating element (7) is placed in a cutout (18) of the locking element (6).

6. The actuating element in accordance with claim 5, wherein the at least one combined indicator/operating element (7) and the locking element (6) are switchable between two operating positions (A, B).

7. The actuating element in accordance with claim 6, wherein the operating sub-element (19) comprises an operating lever (29).

8. The actuating element in accordance with claim 7, wherein the operating lever (29) of the operating sub-element (19) is actuated when the locking element (6) is in the first operating position (A), and is released when the locking element (6) is in the second operating position (B).

9. The actuating element in accordance with claim 8, wherein the indicator sub-element (20) has a surface (21) which terminates flush with a surface (30) of the locking element (6).

10. The actuating element in accordance with claim 9, wherein in an actuated state the operating lever (29) of the operating sub-element (19) rests against a detent of the actuating lever (4).

11. The actuating element in accordance with claim 10, wherein the detent is in a stationary position with respect to the displaceable locking element (6).

12. The actuating element in accordance with claim 11, wherein the detent is formed by a swivel pin (31) received in a bore (14) of the actuating lever (4).

13. The actuating element according to claim 12, having a front system for a PC board (2), with a front plate (3) and the actuating element attached to one end of the front plate (3).

14. The actuating element according to claim 13, wherein the PC board (2) has the front system.

15. The actuating element according to claim 13, wherein a board support having the PC board (2) with the front system that can be levered in and out.

16. The actuating element in accordance with claim 10, wherein the detent is formed by a swivel pin (31) received in a bore (14) of the actuating lever (4).

17. The actuating element in accordance with claim 7, wherein in an actuated state the operating lever (29) of the operating sub-element (19) rests against a detent of the actuating lever (4).

18. The actuating element in accordance with claim 17, wherein the detent is in a stationary position with respect to the displaceable locking element (6).

19. The actuating element in accordance with claim 1, wherein the at least one combined indicator/operating element (7) is placed in a cutout (18) of the locking element (6).

20. The actuating element in accordance with claim 1, wherein the at least one combined indicator/operating element (7) and the locking element (6) are switchable between two operating positions (A, B).

21. The actuating element in accordance with claim 1, wherein the operating sub-element (19) comprises an operating lever (29).

22. The actuating element in accordance with claim 21, wherein the operating lever (29) of the operating sub-element (19) is actuated when the locking element (6) is in the first operating position (A), and is released when the locking element (6) is in the second operating position (B).

23. The actuating element in accordance with claim 1, wherein the indicator sub-element (20) has a surface (21) which terminates flush with a surface (30) of the locking element (6).

24. The actuating element according to claim 1, having a front system for a PC board (2), with a front plate (3) and the actuating element attached to one end of the front plate (3).

25. The actuating element according to claim 1, wherein the indicator sub-element (20) comprises an LED component.

* * * * *